US009685385B1

(12) United States Patent
Hung et al.

(10) Patent No.: US 9,685,385 B1
(45) Date of Patent: Jun. 20, 2017

(54) METHOD OF FABRICATING SEMICONDUCTOR DEVICE

(71) Applicant: UNITED MICROELECTRONICS CORP., Hsin-Chu (TW)

(72) Inventors: Yu-Hsiang Hung, Tainan (TW); Ssu-I Fu, Kaohsiung (TW); Chih-Kai Hsu, Tainan (TW); Wei-Chi Cheng, Kaohsiung (TW); Jyh-Shyang Jenq, Pingtung County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/226,929

(22) Filed: Aug. 3, 2016

(30) Foreign Application Priority Data

Jul. 5, 2016 (TW) .............................. 105121146 A

(51) Int. Cl.
*H01L 21/768* (2006.01)
*H01L 21/8238* (2006.01)
*H01L 21/311* (2006.01)
*H01L 21/306* (2006.01)
*H01L 21/02* (2006.01)
(Continued)

(52) U.S. Cl.
CPC .. *H01L 21/823821* (2013.01); *H01L 21/0217* (2013.01); *H01L 21/02164* (2013.01); *H01L 21/02636* (2013.01); *H01L 21/26513* (2013.01); *H01L 21/30604* (2013.01); *H01L 21/31111* (2013.01); *H01L 21/31144* (2013.01); *H01L 21/76224* (2013.01); *H01L 21/823828* (2013.01); *H01L 21/823871* (2013.01);
(Continued)

(58) Field of Classification Search
CPC ................. H01L 21/823; H01L 21/821; H01L 21/31111; H01L 21/30604; H01L 21/02636; H01L 21/02164; H01L 21/0217; H01L 29/66795; H01L 21/76224; H01L 29/0653; H01L 21/26513; H01L 21/31144; H01L 21/823828; H01L 21/823878; H01L 21/823871
See application file for complete search history.

(56) References Cited

U.S. PATENT DOCUMENTS 7,858,517 B2 * 12/2010 Sato .................. H01L 21/28518
257/E21.165
8,324,043 B2 12/2012 Kim
(Continued)

OTHER PUBLICATIONS

Lu, Title of Invention: Semiconductor Device and Manufacturing Method Thereof, U.S. Appl. No. 14/882,424, filed Oct. 13, 2015.

*Primary Examiner* — Savitr Mulpuri
(74) *Attorney, Agent, or Firm* — Winston Hsu

(57) ABSTRACT

The present invention provides a method for forming a semiconductor device, including the following steps: first, a substrate is provided, at least one gate is formed on the substrate, a contact etching stop layer (CESL) and a first dielectric layer are formed on the substrate in sequence, afterwards, a first etching process is performed to remove the first dielectric layer, and to expose a top surface and at least one sidewall of the etching stop layer, next, a second etching process is performed to partially remove the contact etching stop layer, and to form at least one epitaxial recess in the substrate. Afterwards, an epitaxial process is performed, to form an epitaxial layer in the epitaxial recess, and a contact structure is then formed on the epitaxial layer.

18 Claims, 6 Drawing Sheets

(51) Int. Cl.
*H01L 29/66* (2006.01)
*H01L 21/762* (2006.01)
*H01L 29/06* (2006.01)
*H01L 21/265* (2006.01)

(52) U.S. Cl.
CPC .. *H01L 21/823878* (2013.01); *H01L 29/0653* (2013.01); *H01L 29/66795* (2013.01)

(56) References Cited

U.S. PATENT DOCUMENTS

| | | |
|---|---|---|
| 8,765,546 B1 | 7/2014 | Hung |
| 9,034,706 B2* | 5/2015 | Liu .................... H01L 29/66795 |
| | | 257/E21.431 |
| 9,129,988 B1* | 9/2015 | Lee .................... H01L 29/66545 |
| 9,324,610 B2* | 4/2016 | Hung ................ H01L 21/76897 |
| 2005/0044831 A1* | 3/2005 | Schlesser ............. A01D 34/661 |
| | | 56/6 |
| 2008/0023772 A1 | 1/2008 | Kawakita |
| 2008/0217714 A1* | 9/2008 | Zia .................... H01L 21/76229 |
| | | 257/432 |
| 2014/0124842 A1* | 5/2014 | Wang .................... H01L 23/485 |
| | | 257/288 |
| 2014/0273368 A1* | 9/2014 | Hung ................ H01L 29/66553 |
| | | 438/230 |
| 2016/0104673 A1 | 4/2016 | Tung |
| 2017/0040179 A1* | 2/2017 | Liao .................. H01L 21/31051 |
| 2017/0077031 A1* | 3/2017 | Lu ........................ H01L 23/535 |
| 2017/0084722 A1* | 3/2017 | Lu .................... H01L 29/66795 |

* cited by examiner

METHOD OF FABRICATING SEMICONDUCTOR DEVICE

BACKGROUND OF THE INVENTION

1. Field of the Invention

The present invention relates generally to semiconductor manufacturing process, and more specifically, to a method using self-aligned process to form a semiconductor structure with the epitaxial layers and the contact structures.

2. Description of the Prior Art

Along with the continuous miniaturization of the Integrated Circuits (IC), the line width of interconnections and the feature size of semiconductor devices have continuously shrunk. In general, discrete devices in integrated circuits are connected to each other through contact plugs (or contact slots) and interconnection structures, and their related fabrication methods have become an important matter in the next-generation semiconductor devices.

SUMMARY OF THE INVENTION

The present invention provides a method for forming a semiconductor device, comprising the following steps: first, a substrate is provided, at least one gate is formed on the substrate, a contact etching stop layer (CESL) and a first dielectric layer are formed on the substrate in sequence, afterwards, a first etching process is performed to remove the first dielectric layer, and to expose a top surface and at least one sidewall of the etching stop layer, next, a second etching process is performed to partially remove the contact etching stop layer, and to form at least one epitaxial recess in the substrate. Afterwards, an epitaxial process is performed, to form an epitaxial layer in the epitaxial recess, and a contact structure is then formed on the epitaxial layer.

A key feature of the present invention is while the first etching process is performed, only the hard mask, the CESL and the liner made of silicon nitride are used as the protective layers, and the first dielectric layer made of silicon oxide is completely removed. Therefore, the first recess can be formed without using other additional protective layers. The first recess is disposed beside the metal gate, and there are no other silicon oxide layers disposed between the first recess and the metal gate. In other words, the process mentioned above is a self-aligned process, and the position of the first recess can be decided precisely. In this way, the epitaxial layers and can also be formed precisely, to avoid the issue that the epitaxial layer is too close or far away from the metal gate. Therefore, the mis-alignment issues can be prevented, which also improves the yield.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-8 are schematic diagrams illustrating a manufacturing method of the semiconductor structure according to a first preferred embodiment of the present invention, wherein:

FIG. 1 shows the schematic diagram of two metal gates, at least one contact etching stop layer and at least one first dielectric layer being formed on a substrate;

FIG. 2 shows the schematic diagram after a first etching process is performed;

FIG. 3 shows the schematic diagram after a second etching process is performed;

FIG. 4 shows the schematic diagram after a third etching process and a selective epitaxial growth process are performed;

FIG. 5 shows the schematic diagram after a cap layer is formed;

FIG. 6 shows the schematic diagram after a fifth etching process, a sixth etching process and a selective epitaxial growth process are performed in sequence;

FIG. 7 shows the schematic diagram after a hard mask is removed; and

FIG. 8 shows the schematic diagram after barrier later and a conductive layer are formed.

FIGS. 9-11 are schematic diagrams illustrating a manufacturing method of the semiconductor structure according to a second preferred embodiment of the present invention, wherein:

FIG. 9 shows the schematic diagram of two metal gates, at least one liner, at least one contact etching stop layer and at least one first dielectric layer being formed on a substrate;

FIG. 10 shows the schematic diagram after two epitaxial layers and a dielectric layer are formed;

FIG. 11 shows the schematic diagram after a hard mask is formed.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
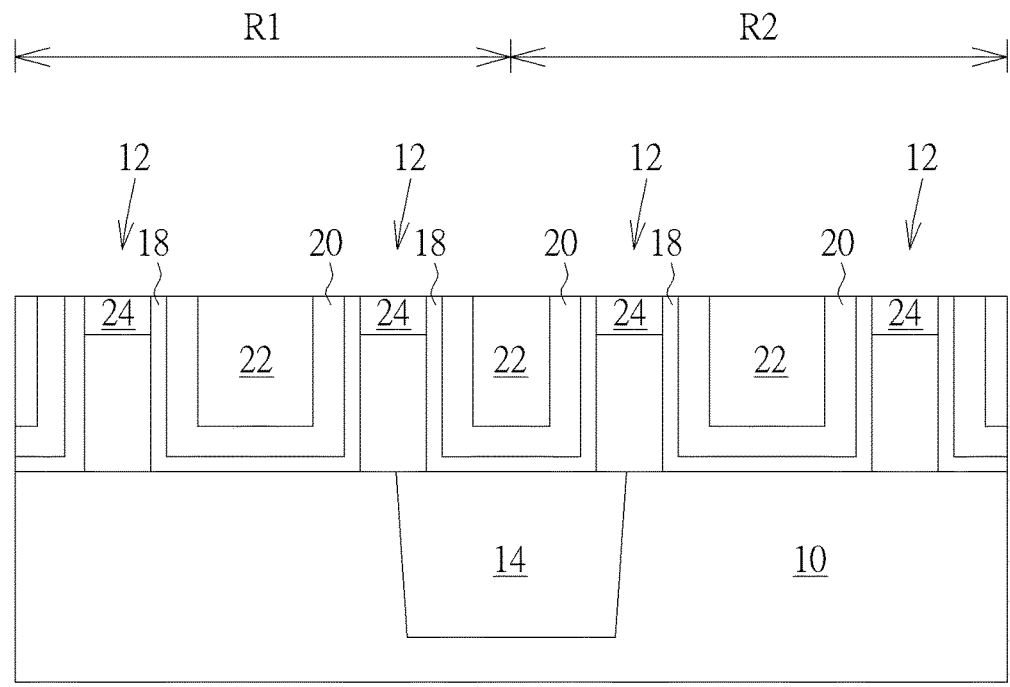

Please refer to FIGS. 1-8, which are schematic diagrams illustrating a manufacturing method of the FinFET semiconductor device according to a first preferred embodiment of the present invention. As shown in FIG. 1, a substrate 10 is first provided, and the substrate 10 includes two regions: a first region R1 and a second region R2. In the following steps, semiconductor devices with different conductivity types will be formed within the first region R1 and within the second region R2 respectively. For example, an n-type transistor will be formed within the first region R1, and a p-type transistor will be formed within the second region R2, but the present invention is not limited thereto.

The substrate 10 comprises at least two metal gates 12 disposed within the first region R1 and within the second region R2 respectively. In addition, the semiconductor device may further comprise at least one fin structure (not shown) disposed on the substrate 10.

In this embodiment, each metal gate 12 comprises metal materials, it may be formed through a replacement metal gate (RMG) process, and will not be redundantly described here. Furthermore, semiconductor device further comprises at least one shallow trench isolation (STI) 14 in the substrate 10 surrounding the metal gate 12, to isolate the metal gate 12 from the fin structures and other electric elements on the substrate 10.

Besides, a liner 18 and a contact etching stop layer (CESL) 20 may be formed on two sides of the metal gate 12. In this embodiment, the liner 18 and the CESL 20 are also disposed on the substrate 10 between the metal gates 12. In addition, after the liner 18 is formed, at least one light doped drain (LDD, not shown) may be formed in the substrate 10. A first dielectric layer 22 is then formed on the substrate 10, and a planarization process is then performed, such as a chemical mechanical polishing (CMP), to have the top surface of the metal gate 12 and the top surface of the first dielectric layer 22 on the same level. It is worth noting that in this embodiment, an etching process is performed after the metal gate 12 is completed, to remove parts of the metal gate 12, and a hard mask 24 is then formed to replace the upper portion of the metal gate 12. Another planarization process is then performed to remove the extra hard mask 24. In other words, in the present embodiment, a hard mask 24 is disposed on the top of the metal gate 12, and the top surface of the hard mask 24 and the top surface of the first dielectric layer 22 are on the same level. Besides, since the hard mask 24 replaces some top portion of the metal gate 12, the hard mask 24 is therefore disposed only on the metal gate 12, and disposed between the spacers 18. In addition, since parts of the spacer 18 and parts of the CESL 20 are removed during another planarization process, the spacer 18 and the CESL 20 have a truncated top surface. In the present embodiment, the spacer 18, the CESL 20 and the hard mask 24 mainly comprise silicon nitride, and the first dielectric layer 22 mainly comprises silicon oxide, but not limited thereto. These elements and the manufacturing methods thereof are well known to persons of ordinary skills in the art and the details will not be described here.

Figure 2:
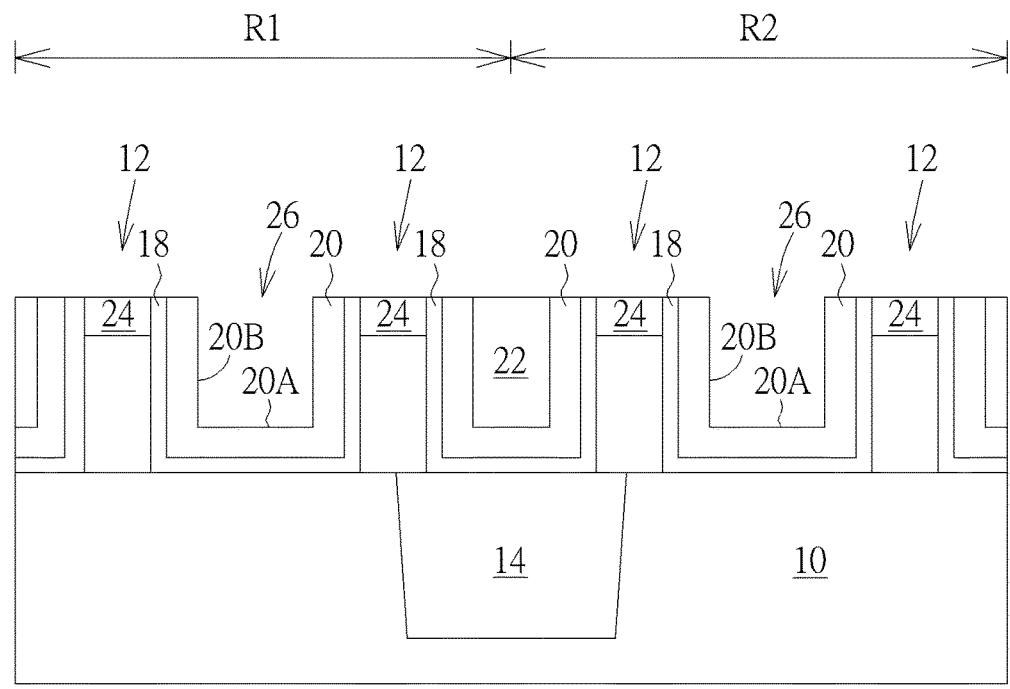
Figure 3:
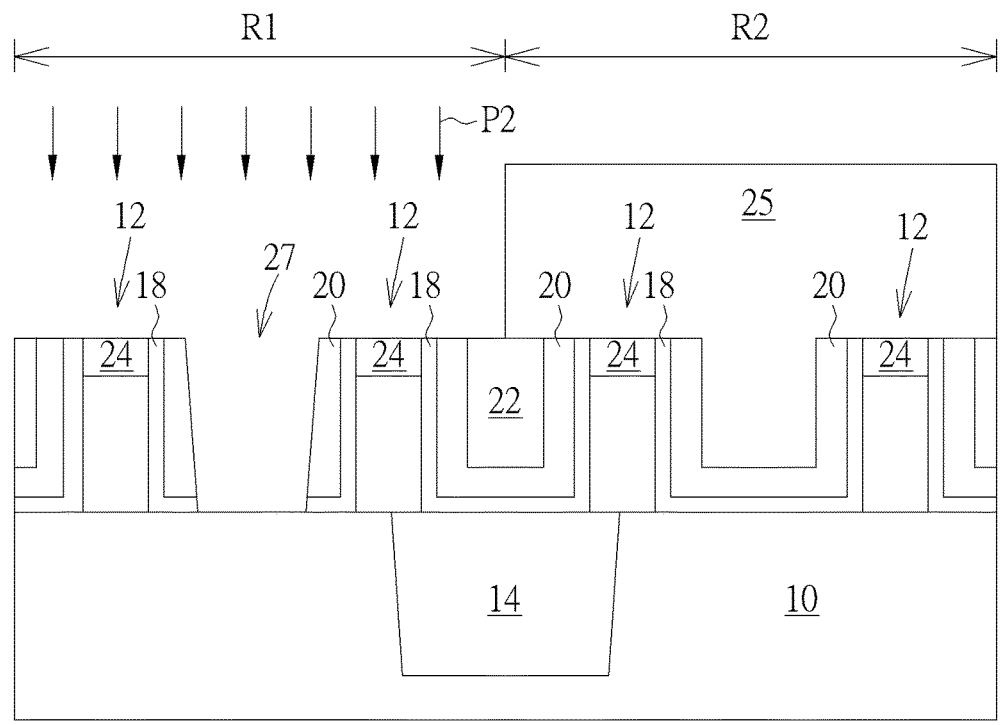

Next, as shown in FIG. 2, a first etching process P1 is performed, to completely remove the first dielectric layer 22 within the first region and within the second region, and a plurality of first recesses 26 are therefore formed. It is noteworthy that after the first dielectric layer 22 is removed, each first recess exposes a bottom surface 20A and at least one sidewall 20B of the CESL 20 (as shown in FIG. 2). Afterwards, as shown in FIG. 3, a photoresist layer 25 is formed within the second region R2, and a second etching process P2 is performed, to partially remove the CESL 20 and the liner 18 within the first region R1, so as to form a second recess 27, the second recess 27 exposes the substrate 10. It is noteworthy that in this embodiment, the material of the CESL 20, the liner 18 and the hard mask 24 include silicon nitride, so the hard mask 24 may be partially etched during the second etching process P2 (not shown). But in this embodiment, the thickness of the hard mask 24 is larger than the sum of the thickness of the ESL 20 and the liner 18, for example, the thickness of the hard mask 24 is about 400 angstroms, the thickness of the liner 18 is about 30 angstroms, and the thickness of the CESL is about 20 angstroms, so after the second etching process P2 is performed, the hard mask 24 is not removed completely, and the metal gate 12 still covered by the hard mask 24.

The first etching process P1 of the present invention uses etching gases, which may comprise per fluorocarbon gases, such as tetrafluoromethane ($CF_4$), fluoroform ($CHF_3$), hexafluoride-1,3+butadiene ($C_4F_6$), and further comprises oxygen and argon, but not limited thereto. It is worth noting that the higher the ratio of per fluorocarbon gases to oxygen in the etching gas is, the higher the selectivity of the silicon nitride to silicon oxide will be. In other words, the more per fluorocarbon gases are present in the etching gas, the faster the etching rate will be for etching the silicon nitride, compared with the etching rate for etching the silicon oxide. In this embodiment, the main material of the first dielectric layer 22 is silicon oxide, the main material of the CESL 20 is silicon nitride, and the etching gas in first etching process P1 is a high selectivity gas (to silicon nitride and silicon oxide), and the selectivity is preferably larger than 5, so the etching rate for etching the first dielectric layer 22 will be relatively fast, but the etching rate for etching the CESL 20 is relatively slow when the first etching process P1 is performed. The etching rate for etching the first dielectric layer 22 is at least five times higher than the etching rate for etching the CESL 20, so the CESL 20 is not easily etched through during the first etching process P1, and the etching will stop on the surface of the CESL 20. Afterwards, the etching gas is adjusted for the second etching process P2, and the CESL 20 and the liner 18 will be partially removed during the second etching process P2.

Figure 4:
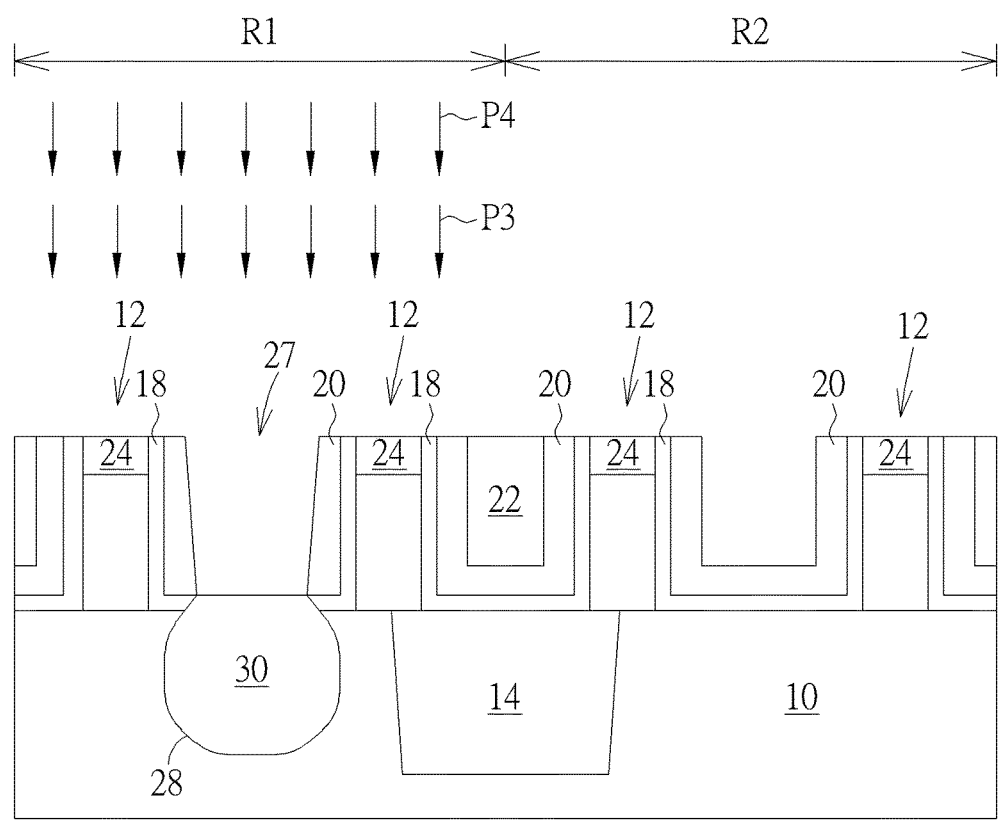

As shown in FIG. 4, a third etching process P3 is then performed within the first region R1, to etch the exposed substrate 10, and so as to format least one epitaxial recess 28 within the first region R1. Next, a selective epitaxial growth (SEG) method P4 is performed to form an epitaxial layer 30 in the epitaxial recess 28, and the epitaxial layer 30 fills up the epitaxial recess 28. It is well-known to those skilled in the art that in the SEG method P4, the epitaxial layer 30 is to grow along each surface of the epitaxial recess 28. It is noteworthy that the photoresist layer 25 will be removed before the SEG method P4 is performed (for example, it may be removed between the second etching process P2 and the third etching process P3, or removed between the third etching process P3 and the SEG method P4), to avoid the photoresist layer 25 being damaged by the high temperature during the SEG method P4. In addition, in one embodiment of the present invention, depending on the conductivity of the transistor (such as p-type or n-type), the epitaxial layer 30 may comprise a SiGe, SiC or SiP epitaxial layer. Take the first embodiment as an example, since an n-type transistor will be formed within the first region R1, so the epitaxial layer 30 comprises a SiC epitaxial layer.

Figure 5:
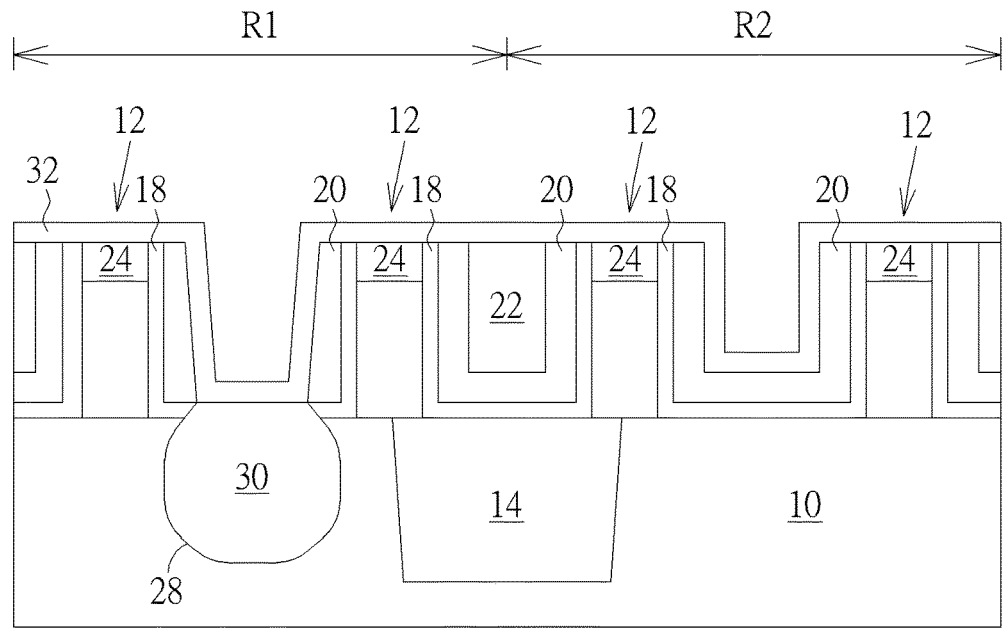

After the epitaxial layer 30 within the first region R1 is formed, as shown in FIG. 5, a cap layer 32 is then formed within the first region R1 and the second region R2. The cap layer 32 covers the epitaxial layer 30 within the first region R1, and disposed in the first recess 26 within the second region R2. Besides, the cap layer 32 includes a silicon nitride layer, same as the CESL 20, the liner 18 and the hard mask 24.

Figure 6:
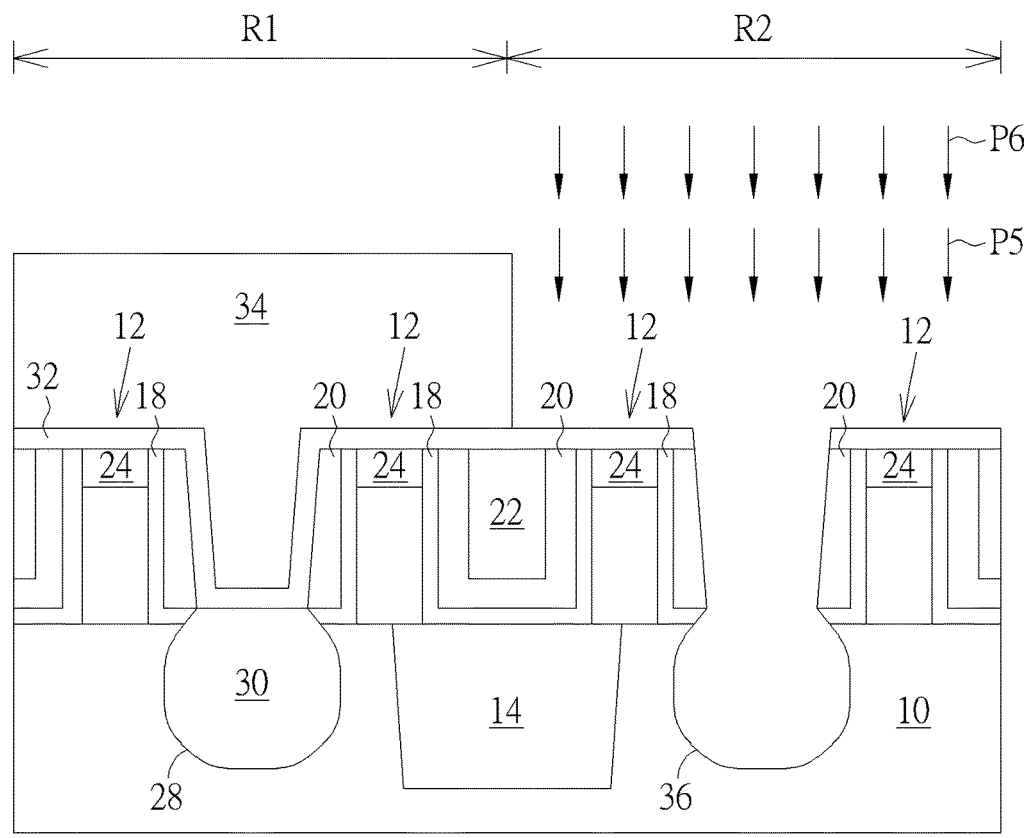

As shown in FIG. 6, a photoresist layer 34 is formed within the first region R1, covers the metal gate 12 and the epitaxial layer 30. Next, a fifth etching process P5 and a sixth etching process P6 are formed within the second region R2 in sequence. The fifth etching process P5 and the sixth etching process P6 are similar to the second etching process P2 and the third etching process P3 mentioned above, please refer to the paragraphs mentioned above and FIGS. 3-4. The fifth etching process P5 removes parts of the cap layer 32, parts of the CESL 20 and parts of the liner 18 within the second region R2, and to expose the substrate 10; the sixth etching process P6 removes parts of the substrate 10 within the second region R2, and to form an epitaxial recess 36.

Figure 7:
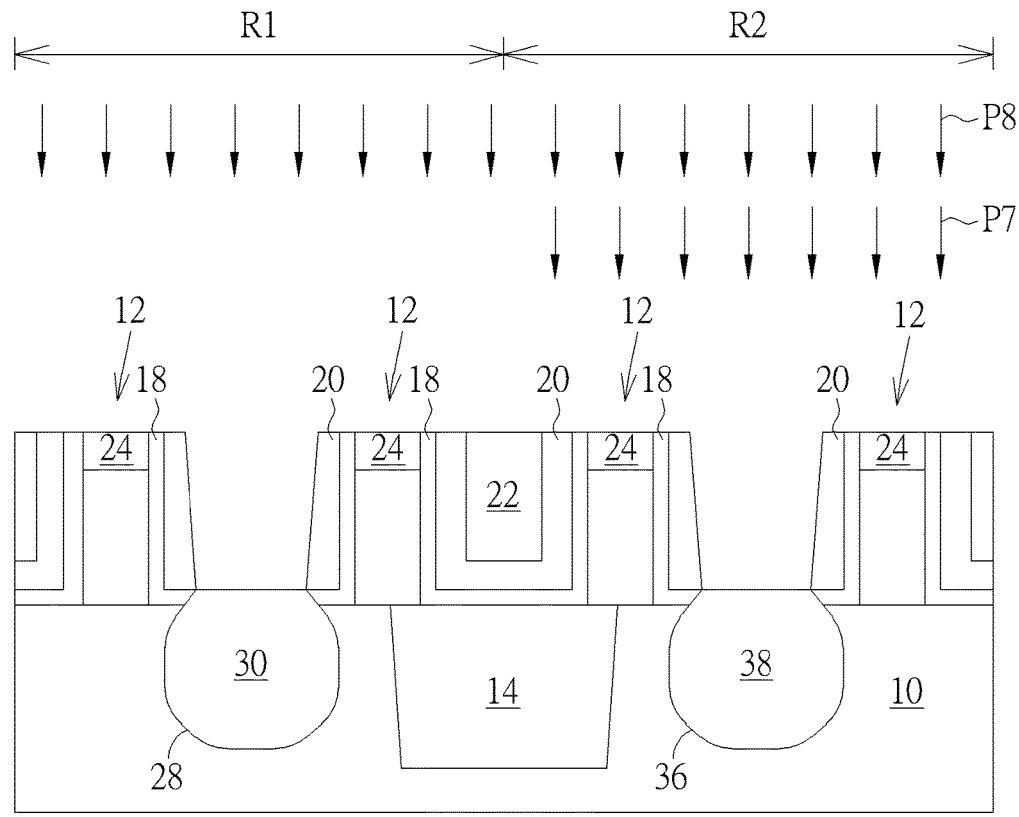

As shown in FIG. 7, after the photoresist layer 34 is removed, a selective epitaxial growth (SEG) method P7 is performed, the SEG method P7 is similar to the SEG method P4 (please refer to FIG. 4), and to form an epitaxial layer 38 in the epitaxial recess 36. In this embodiment, since a p-type transistor will be formed within the second region R2, the epitaxial layer 38 may include a SiGe epitaxial layer.

Besides, in some embodiments, a silicide process (or a salicide process, not shown) may be selectively performed, to form a silicide layer on the surface of the epitaxial layer 30 and the epitaxial layer 38. Furthermore, the embodiment mentioned above takes the planar transistor as an example, but the present invention can be applied to the non-planar transistor (such as finFET) too, and it should also be within the scope of the present invention.

Figure 8:
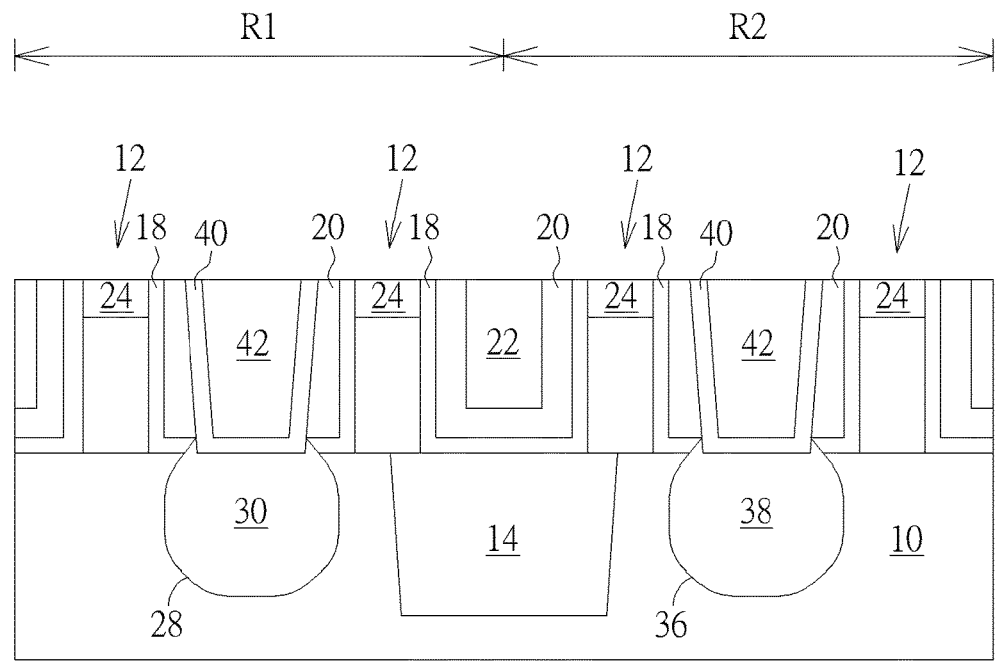

Next, after the cap layer 32 is removed, the epitaxial layer 30 and the epitaxial layer 38 are exposed. At this step, an ion implantation process P8 may be performed to dope impurities, or impurities may be doped while performing the SEG methods P4 or P7, so that the epitaxial layers 30, 38 can be used as a source/drain region. Besides, in order to protect the epitaxial layers 30 and 38, another dielectric layer (not shown) can be formed on the epitaxial layers 30 and 38, and the dielectric layer will be removed before the contact structures is formed. In another case, as shown in FIG. 8, after the epitaxial layers 30 and 38 are exposed, a barrier layer 40 and a conductive layer 42 are formed on the epitaxial layers 30 and 38 through a method such as a chemical vapor deposition (CVD), a physical vapor deposition (PVD), or anatomic layer deposition (ALD). The barrier layer 40 includes such as titanium (Ti), titanium nitride (TiN), tantalum (Ta) or tantalum nitride (TaN), and the conductive layer 42 includes materials with low resistance and superior gap-filling characteristic, such as tungsten (W), aluminum (Al), titanium aluminide (TiAl), or titanium aluminum oxide (TiAlO), but not limited to this.

A key feature of the present invention is while the first etching process P1 is performed (please refer to FIG. 2), only the hard mask 24, the CESL 20 and the liner 18 made of silicon nitride are used as the protective layers, and the first dielectric layer 22 made of silicon oxide is completely removed. Therefore, the first recess 26 can be formed without using other additional protective layers. The first recess 26 is disposed beside the metal gate 12, and there are no other silicon oxide layers disposed between the first recess 26 and the metal gate 12. In other words, the process mentioned above is a self-aligned process, the position of the first recess 26 can be decided precisely. In this way, the epitaxial layers 30 and 38 can also be formed precisely, to avoid the issue that the epitaxial layer is too close or far away from the metal gate. Therefore, the mis-alignment issues can be prevented, which also improves the yield.

The following description will detail the different embodiments of the semiconductor device and the manufacturing method of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 9:
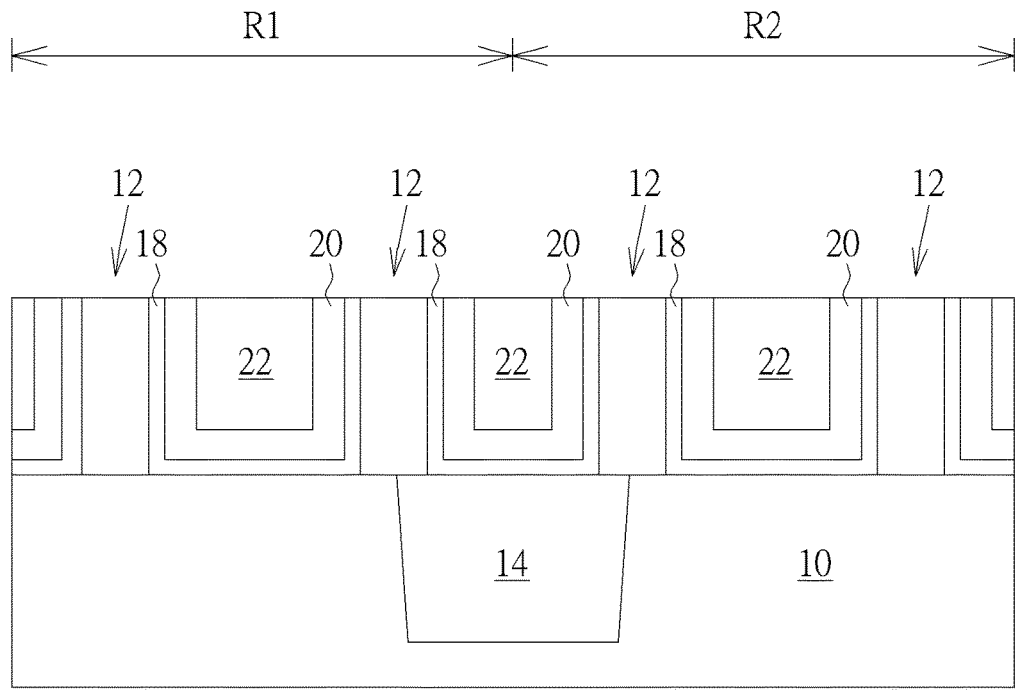
Figure 10:
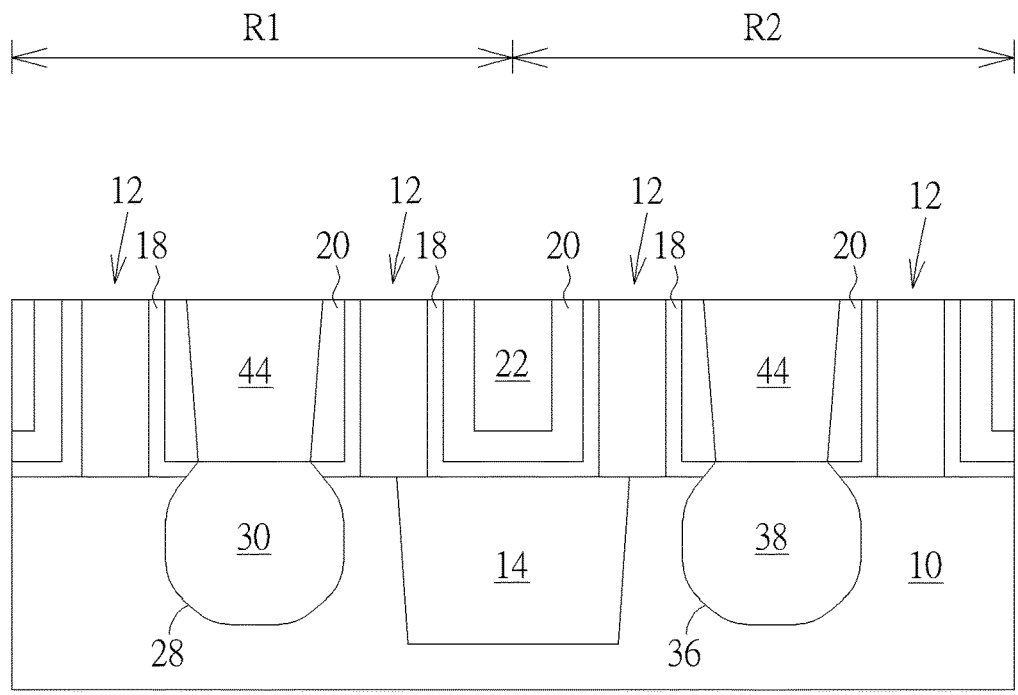
Figure 11:
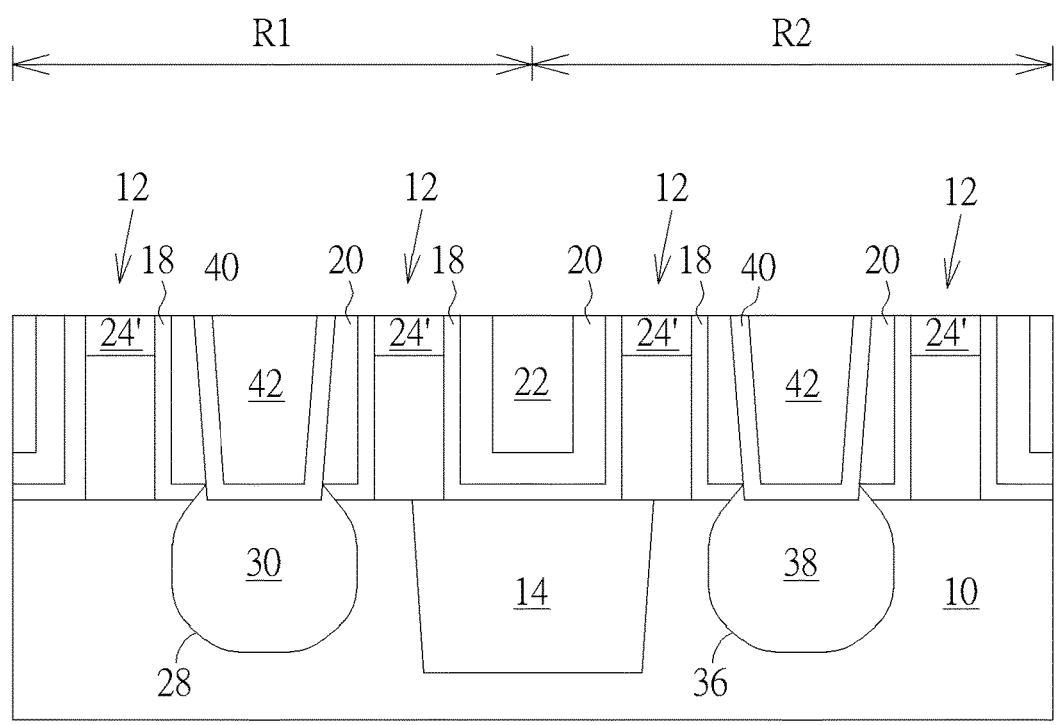

In another embodiment of the present invention, please refer to FIGS. 9-11. Firstly, as shown in FIG. 9, similar to the first embodiment mentioned above, a substrate 10 is provided, the first region R1 and the second region R2 are defined on the substrate 10, and the metal gate 12, the liner 18, the CESL 20 and the first dielectric layer 22 are formed on the substrate 10. The difference between this embodiment and the first preferred embodiment is that in this embodiment, the first recess and the epitaxial recess are formed by the self-aligned process mentioned above, so there is no need to form a hard mask on the top surface of the metal gate 12. More precisely, the hard mask hasn't been formed on the top surface of the metal gate 12 before the first etching process is performed. Therefore, the top surface of the metal gate 12 and a top surface of the first dielectric layer 22 are on a same level.

The following steps are similar to the steps mentioned in the first preferred embodiment, including forming the first recesses, forming the epitaxial recesses and forming the epitaxial layers within the first region R1 and the second region R2 respectively. As shown in FIG. 10, while the epitaxial layer 30 and the epitaxial layer 38 are formed within the first region R1 and the second region R2, a dielectric layer 44 is formed on the substrate 10, and covers and protects the epitaxial layer 30 and the epitaxial layer 38. Next, a planarization process is performed to remove the extra dielectric layer 44. Afterwards, as shown in FIG. 11, since the top surface of the metal gate 12 is exposed, and until this step, an etching process is performed to remove a top portion of the metal gate 12, and to form a hard mask 24' to replace the upper portion of the metal gate 12. Another planarization process is then performed to remove the extra hard mask 24'. The following steps are also same as the steps mentioned in the first preferred embodiment, including forming the barrier layer and the conductive layer on the epitaxial layers 30 and 38 respectively, and will not be described again. It should also be within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming semiconductor device, comprising the following steps:
   providing a substrate;
   forming at least one gate on the substrate;
   forming a contact etching stop layer (CESL) and a first dielectric layer sequentially on the substrate;
   performing a first etching process to remove the first dielectric layer, and to expose a bottom surface and sidewall of the CESL;
   performing a second etching process, to remove parts of the CESL, and to form at least one epitaxial recess in the substrate;
   forming an epitaxial growth process, to form a epitaxial layer in the epitaxial recess; and
   forming a contact structure on the epitaxial layer.

2. The method of claim 1, further comprising forming a liner on two sides of the gate.

3. The method of claim 2, wherein the CESL is formed after the liner is formed.

4. The method of claim 3, wherein the material of both the liner and the CESL comprise silicon oxide.

5. The method of claim 1, wherein the material of the first dielectric layer comprises silicon nitride.

6. The method of claim 1, further comprising forming at least one fin structure on the substrate, wherein the gate crosses over the fin structure.

7. The method of claim 6, further comprising:
   forming a shallow trench isolation in the substrate, wherein the shallow trench isolation surrounds the fin structure.

8. The method of claim 1, further comprising performing an ion implantation process on the epitaxial layer.

9. The method of claim 1, further comprising forming a first hard mask on a top surface of the gate.

10. The method of claim 9, wherein a top surface of the first hard mask and a top surface of the first dielectric layer are on a same level.

11. The method of claim 9, wherein the first etching process is performed after the first hard mask is formed.

12. The method of claim 9, wherein the first hard mask is formed after the epitaxial layer is formed.

13. The method of claim 9, wherein the thickness of the first hard mask is larger than the thickness of the CESL.

14. The method of claim 1, wherein the gate comprises a metal gate.

15. The method of claim 1, further comprising forming a second hard mask on the epitaxial layer after the epitaxial layer is formed.

16. The method of claim 15, wherein the second hard mask is removed before the contact structure is formed.

17. The method of claim 1, further comprising forming a second gate in the substrate.

18. The method of claim 17, further comprising forming at least one second epitaxial layer in the substrate beside the second gate, wherein the second epitaxial layer and the epitaxial layer have complementary conductivity types.

* * * * *